United States Patent [19]
Breed et al.

[11] 4,435,484
[45] Mar. 6, 1984

[54] DEVICE FOR PROPAGATING MAGNETIC DOMAINS

[75] Inventors: Dirk J. Breed; Bernardus A. H. Van Bakel; Antonius B. Voermans; John M. Robertson, all of Eindhoven, Netherlands

[73] Assignee: U.S. Philips Corporation, New York, N.Y.

[21] Appl. No.: 274,974

[22] Filed: Jun. 18, 1981

[30] Foreign Application Priority Data

Jul. 22, 1980 [NL] Netherlands ............... 8004201

[51] Int. Cl.³ .............. G11C 11/02; C04B 35/50
[52] U.S. Cl. .............. 428/693; 156/DIG. 63; 252/62.57; 365/33; 428/692; 428/700; 428/702; 428/900
[58] Field of Search .......... 252/62.57; 428/900, 428/700, 692, 693, 702; 156/DIG. 63, 617 SP, 605, 606, 624; 365/33

[56] References Cited

U.S. PATENT DOCUMENTS

| | | | |
|---|---|---|---|
| 3,745,046 | 7/1973 | Mee et al. | 117/235 |
| 4,018,692 | 4/1977 | Akselrad et al. | 252/62.57 |
| 4,138,530 | 2/1979 | Breed et al. | 252/62.57 |

FOREIGN PATENT DOCUMENTS

| | | | |
|---|---|---|---|
| 2232902 | 2/1973 | Fed. Rep. of Germany. | |
| 51-18897 | 2/1976 | Japan | 252/62.57 |

OTHER PUBLICATIONS

"Properties and Device Applications of Magnetic Domains in Orthoferrites," A. H. Bobeck, The Bell Sys. Tech. J., Oct. 1967, pp. 1901–1925.

*Primary Examiner*—Ellis P. Robinson
*Attorney, Agent, or Firm*—Marc D. Schechter

[57] ABSTRACT

A device for propagating magnetic domains includes a monocrystalline nonmagnetic substrate of a rare earth gallium garnet bearing a layer of an iron garnet capable of supporting local enclosed magnetic domains. The iron garnet layer is grown in compression on a (100) face of the nonmagnetic substrate. The iron garnet comprises manganese in part of the iron sites of its crystal lattice, and comprises yttrium and at least one representative selected from the group comprising bismuth and the rare earth metals in the dodecahedral lattice sites. Such a magnetic garnet has a very high uniaxial anisotropy and a high domain mobility. These properties make the device extremely suitable for propagating submicron magnetic domains having diameters as small as 0.4 μm.

7 Claims, 1 Drawing Figure

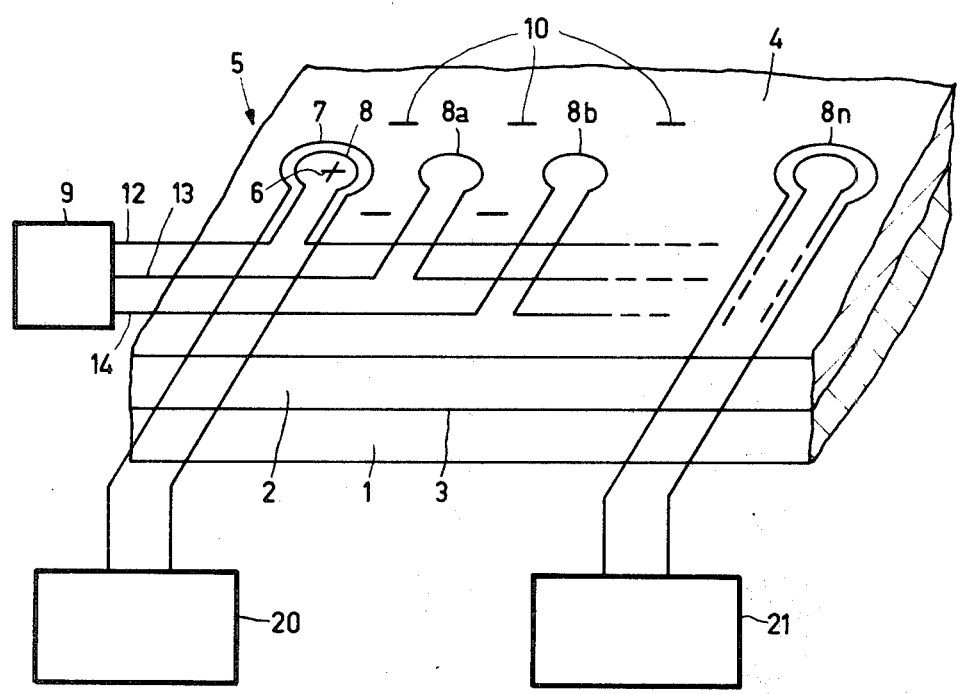

DEVICE FOR PROPAGATING MAGNETIC DOMAINS

BACKGROUND OF THE INVENTION

The invention relates to devices for propagating magnetic domains. Such devices each include a monocrystalline nonmagnetic substrate bearing a layer of an iron garnet capable of supporting local enclosed magnetic domains. The iron garnet layer has a stress-induced uniaxial magnetic anisotropy component. The stress is caused by growing the layer in compression on the nonmagnetic substrate. The iron-garnet is of the class of iron garnet materials with positive magnetostriction constants.

In magnetic "bubble" domain devices, the smaller the bubble diameter, the larger the information storage density which can be achieved. Iron garnet bubble domain materials are preferred in bubble domain technology because small diameter bubble domains are stable in these materials. For a bubble domain material to be useful for use in bubble domain devices, it is also important that the bubbles formed in the material should have a high wall mobility so that comparatively small driving fields can cause rapid bubble movement. This property enables one to operate the device at high frequencies and at low energy dissipation.

It is also important that the magnetic bubble domain material should have a high uniaxial anisotropy. This is necessary in order to avoid spontaneous nucleation of bubbles. This is of great importance for reliable information storage and processing within the bubble domain material.

The overall uniaxial anisotropy ($K_u$) may have contributions of stress-induced ($K_u^s$) and growth-induced ($K_u^g$) components. This means that $$K_u \approx K_u^s + K_u^g. \qquad (1)$$

In a bubble domain material known from German Offenlegungsschrift No. 2,232,902, $K_u$ is mainly determined by the stress-induced component. This known bubble domain material is obtained by depositing a single crystal iron garnet film having a selected crystallographic orientation and having a positive magnetostriction constant, on a substrate. The lattice constant of the film is larger than the lattice constant of the substrate. When such a film having a positive magnetostriction constant is placed under a compressive stress, the magnetostriction contribution to the magnetic anisotropy tends to produce an easy axis of magnetization perpendicular to the plane of the film.

The bubble domain material which resulted from the above concept was a (111) oriented film of $Tb_3Fe_5O_{12}$ which had been deposited on a $Sm_3Ga_5O_{12}$ substrate. The value of the required positive magnetostriction constant was determined by the choice of the rare-earth ion in the bubble domain material, and the amount of compressive stress was determined by the choice of the substrate.

This concept does not lead to a bubble domain material which is suitable for propagating therein bubble domains having a diameter smaller than 1 μm, while using comparatively low driving fields (for which purpose a high $K_u$ and a high wall mobility are required) and which can also be deposited on a $Gd_3Ga_5O_{12}$ substrate. As a matter of fact, to achieve a high $K_u$ by the incorporation of rare-earth ions having a high positive magnetostriction constant inevitably leads to the use of Sm and Eu ions, which provide considerable, undesireable damping. On the other hand a high $K_u$ can be achieved to only a limited extent by increasing the compression of the film. This is because when the compression becomes too large, it disappears and the film comes under a tensile stress. Moreover, this would require the use of substrate materials other than $Gd_3Ga_5O_{12}$ (lattice parameter 12.376).

SUMMARY OF THE INVENTION

It is an object of the invention to provide a device for propagating magnetic domains having a bubble domain layer which is deposited on $RE_3Ga_5O_{12}$ and which is suitable for the propagation of submicron bubble domains with comparatively small driving fields. In the substrate composition, RE is selected from the group of rare-earth ions, and is preferably is Gd, because $Gd_3Ga_5O_{12}$ is the most common substrate material.

This object is achieved by using as a bubble domain material an iron garnet in which the iron lattice sites are partly occupied by manganese, and in which the dodecahedral lattice site are occupied by ions which contribute little to the damping. This material is deposited on a (100) face of a rare-earth gallium garnet substrate.

With this type of material, the magnetostriction constant is determined by the manganese-ion. This allows one to choose ions for the dodecahedral sites based on their low damping and not on the basis of their high magnetostriction constant. It has been found that magnetic anisotropy constants, $K_u$, of $1 \times 10^5$ to $2 \times 10^5$ erg/cm$^3$ can be achieved in such materials so that they are suitable for use in bubble domain devices having bubble domains of a diameter as small as, for example, 0.4 μm. The crystallographic orientation of the bubble domain layer is chosen to take the maximum advantage of the positive magnetostriction constant of manganese. Gadolinium and yttrium may be used as low damping rare-earth ions. By varying the Gd/Y ratio, the "misfit" and hence the mechanical stress can be adjusted.

A preferred material for maximizing the stress-induced anisotropy is $\{Bi, Y\}_3(Fe,Mn,Ga)_5O_{12}$. By varying the Bi/Y ratio, the misfit can be adjusted without decreasing the saturation magnetization, $4\pi M_s$, too much. In contrast, when Gd/Y is used, the Gd/Y ratio can only be reduced by omitting gallium which, upon substitution in the iron sites, reduces the magnetization. Where elements besides gallium can be substituted for iron and where for certain purposes small quantities of rare-earth ions can be incorporated in the dodecahedral lattice sites, a more general formula for this material is $\{Bi, Y, RE\}_3(Fe,Mn,Q)_5O_{12}$, where Q is a nonmagnetic ion which preferably substitutes in the tetrahedral lattice sites.

Depending on the anisotropy required for certain applications, the choice of magnetostriction constant (for which Mn is incorporated) dictates the difference in lattice parameter between the film and substrate which is required. It has proven possible, for example, to grow the present films in compression on a gadolinium-gallium substrate with a "mismatch", $(a_o-a_1)/a_o$, as large as $-1 \times 10^{-2}$. Such a mismatch satisfies all device requirements (no cracks, tears, etc.). However, for most applications the "mismatch" will lie between $-1 \times 10^{-3}$ and $-6 \times 10^{-3}$.

BRIEF DESCRIPTION OF THE DRAWING

The FIGURE shows, partly schematically, partly in perspective, and partly in section, a bubble domain device according to the invention.

DESCRIPTION OF THE PREFERRED EMBODIMENTS

Films of the nominal composition $\{Gd,Y\}_3(Fe,Mn,Ga)_5O_{12}$ were grown on a first series of GGG substrates by liquid phase epitaxy methods from a melt using a $PbO/B_2O_3$ flux. The Ga content was varied to adjust the saturation magnetization, the ratio $Gd_2O_3/Y_2O_3$ in the melt was varied to adjust the lattice constant, and the Mn content was varied to adjust the magnetostrictive constant of the deposited layer. Films of the nominal composition $\{Bi,Y\}_3(Fe,Mn,Ga)_5O_{12}$ were also deposited on a second series of GGG substrates. Again, liquid phase epitaxy was used with the same flux.

The layers described above were grown on substrates which were dipped horizontally in the melt. Each substrate had a diameter of 2.5 cm and a (100) oriented deposition face. Growth was at temperatures between 750° and 950° C. for periods which varied from 0.25–2 minutes. The substrates were roated at 100 rpm, with the direction of rotation being reversed after every five rotations. The film thicknesses varied from 0.5 to 4.5 $\mu m$.

EXAMPLE 1

For growing a layer having the nominal composition $\{Gd,Y\}_3(Fe,Mn,Ga)_5O_{12}$, the following oxides were weighed out in the following quantities:
PbO—87 g
$B_2O_3$—1.81 g
$Y_2O_3$—0.27 g
$Gd_2O_3$—0.37 g
$Ga_2O_3$—0.46 g
$Fe_2O_3$—8.18 g
$Mn_2O_3$—1.86 g The oxides were mixed and the mixture was melted and heated at a temperature of 876° C. A $Gd_3Ga_5O_{12}$ substrate having a (100) oriented deposition face was dipped in the melt for 2 minutes, resulting in the deposition of a 4.4 $\mu m$ thick layer. The estimated composition of the layer was: $Y_{1.1}Gd_{1.9}Fe_{3.8}Mn_{0.7}Ga_{0.5}O_{12}$.

EXAMPLE 2

For growing a layer having the nominal composition $\{Y,Gd\}_3(Fe,Mn)_5O_{12}$, the following oxides were weighed out in the following quantities:
$B_2O_3$—1.81 g
PbO—87 g
$Y_2O_3$—0.27 g
$Gd_2O_3$—0.37 g
$Fe_2O_3$—8.18 g
$Mn_2O_3$—1.86 g The oxides were mixed and the mixture was melted and heated at a temperature of 876° C. A $Gd_3Ga_5O_{12}$ substrate having a (100) oriented deposition face was dipped in the melt for 15 seconds resulting in the deposition of a 0.55 $\mu m$ thick layer. The estimated composition of the layer was $Y_{1.1}Gd_{1.9}Fe_{3.8}Mn_{1.2}O_{12}$.

EXAMPLE 3

For growing a layer having the nominal composition $\{Y,Gd\}_3(Fe,Mn,Ga)_5O_{12}$, the following oxides were weighed out in the following quantities:

PbO—84 g
$B_2O_3$—1.81 g
$Y_2O_3$—0.36 g
$Gd_2O_3$—0.23 g
$Ga_2O_3$—0.46 g
$Fe_2O_3$—8.18 g
$Mn_2O_3$—1.86 g

The oxides were mixed and the mixture was melted and heated at a temperature of 898° C. A $Gd_3Ga_5O_{12}$ substrate having a (100) oriented deposition face was dipped in the melt for 2 minutes resulting in the deposition of a 3.88 $\mu m$ thick layer. The estimated composition of the layer was $Y_{2.1}Gd_{0.9}Fe_{3.8}Mn_{0.7}Ga_{0.5}O_{12}$.

EXAMPLE 4

For growing a layer having the nominal composition $\{Bi,Y\}_3(Fe,Mn,Ga)_5O_{12}$, the following materials were weighed out in the following quantities:
$Bi_2O_3$—133.47 g
PbO—319.71 g
$MnCO_3$—12.00 g
$Y_2O_3$—2.0 g
$Fe_2O$—29.88 g
$Ga_2O_3$—0.1 g The oxides were mixed and the mixture was melted and heated at a temperature of 778° C. A $Gd_3Ga_5O_{12}$ substrate having a (100) oriented deposition face was dipped in the melt for 60 seconds resulting in the deposition of a layer having a thickness of 0.76 $\mu m$.

The Table below gives the properties of the magnetic layers grown by the processes described in Examples 1 to 4 above.

TABLE

| Example | 1 | 2 | 3 | 4 |
|---|---|---|---|---|
| $(a_o - a_1)/a_o$ | $-2.5 \times 10^{-3}$ | | $-1.08 \times 10^{-3}$ | $-3.16 \times 10^{-3}$ |
| $B(\mu m)$ | 3.59 | | 2.04 | |
| $K_u$ (erg/cm³) | $2 \times 10^5$ | | $9.3 \times 10^4$ | $1.8 \times 10^5$ |
| $\Delta H$ (Oe) | | | 25 | 10 |
| $4\pi M_s$ (Gauss) | 467 | 1300 | 665 | 1779 |
| $\mu$ (m sec$^{-1}$Oe$^1$) | 11 | 44* | 23 | 60* |
| Q | 23 | 3.1* | 5.6 | 1.4 |

In the above Table, B is the stable strip domain width, $K_u$ is the uniaxial anisotropy constant, $\Delta H$ is the ferromagnetic resonance line width at 10 GHz, $4\pi M_s$ is the saturation magnetization, $\mu$ is the bubble domain mobility and $Q = H_A/4\pi M$, where $H_A$ is the anisotropy field and $4\pi M$ is the demagnetizing field. (The asterisk denotes values which were not measured directly but which were calculated based on other, measured values.)

The uniaxial anisotropy constants of the resulting films were determined by means of a torsion magnetometer. Values up to $2 \times 10^5$ erg/cm³ were thus realized for both $\{Gd,Y\}_3(Fe,Mn)_5O_{12}$ and $(Bi,Y)_3(Fe,Mn,Ga)_5O_{12}$ films on GGG.

According to the invention, a new type of bubble domain material has been provided with properties which make it an excellent choice for use in bubble domain propagation devices with submicron bubble domains. Materials suitable for use with 0.4 $\mu m$ diameter bubble domains have been realized. Those skilled in the art will be capable of varying the composition of the bubble domain layer while using the above-given general composition, without departing from the scope of this invention. The examples are therefore only by way of illustration and are they not limiting.

Referring to the sole FIGURE, in one embodiment of the invention a substrate 1 and a bubble domain layer 2 are provided for the active storage and movement of magnetic domains. Substrate 1 and layer 2 adjoin along a common interface 3. The layer 2 has an upper surface 4 remote from the interface 3. Conventional propagation and detection elements for propagating and sensing magnetic domains are provided on Surface 4. The layer 2 may, in general, be used for various processes in digital logic as described in patents and other technical literature. For example, the Bell System Technical Journal, XLVI, No. 8, 1901-1925 (1967) contains an article entitled "Properties and Device Applications of Magnetic Domains in Orthoferrites" which shows such uses.

The FIGURE of the accompanying drawing shows a rather simple configuration which only represents a fragment of a normally larger device comprising a layer 2, for storage and movement of magnetic domains, and various conventional elements for the excitation, propagation and sensing of magnetic domains. The FIGURE may be considered to be a shift register 5 in which, according to the invention, the layer 2 is a magnetic material having a high uniaxial magnetic anisotropy and a high domain mobility. The easy axis of magnetization of the layer 2 is perpendicular to the surface 4. The general magnetization of layer 2 is represented by lines of magnetic flux perpendicular to the surface 4. These flux lines are shown as minus signs 10. Magnetic flux lines situated within the domains and directed opposite to their surroundings are shown as plus signs, for example the plus sign 6 within loop 7.

Current through conductors 12, 13 and 14 is governed by a domain propagator 9. These conductors can be connected to or can be present in the immediate proximity of the surface 4 of the layer 2. The conductors 12, 13 and 14 are coupled respectively to successive triads of conductive loops, for example loops 8, 8a, and 8b of a first triad. An array of rows and columns of such multiple loop arrangement is often used in storage systems.

The magnetic bias field for stabilizing excited domains is provided in a conventional manner, for example, by using a coil or coils (not shown) which surround the substrate-bubble domain layer configuration, or by using permanent magnets.

During operation of the device, the magnetic domains are generated by means of a conventional domain generator 20 combined with a loop 7 which is substantially coaxial with a loop 8. A stable cylindrical magnetic domain, for example indicated by the plus sign 6, can be propagated in incremental steps from the loop 8 to the loop 8a, to the loop 8b, and so on by successive excitation of the conductors 12, 13 and 14 by the domain propagator 9. When a propagated magnetic domain reaches loop 8n, it can be detected by means of domain sensor 21. It will be obvious that other digital logic functions can easily be carried out while using the same known methods as those which are used in the example of the shift register 5.

What is claimed is:

1. A device for propagating magnetic domains comprising:
a monocrystalline, nonmagnetic substrate having a deposition face; and
a monocrystalline layer of an iron garnet, capable of supporting localized, enclosed magnetic domains, grown in compression on the deposition face of the substrate, said iron garnet layer having a positive magnetostriction constant and having a mechanical stress-induced uniaxial magnetic anisotropy component;
characterized in that:
the iron garnet has iron lattice sites and dodecahedral lattice sites, the iron garnet comprises manganese at a portion of the iron lattice sites and the iron garnet consists essentially of ions which contribute little to damping at the dodecahedral lattice sites;
the nonmagnetic substrate is a rare earth-gallium garnet; and
the iron garnet layer has been grown on a (100) deposition face of the substrate.

2. A device as claimed in claim 1, characterized in that at the dodecahedral lattice sites the iron garnet consists essentially of one or more elements from the group consisting of gadolinium and yttrium.

3. A device as claimed in claim 1, characterized in that at the dedecahedral lattice sites the iron garnet consists essentially of bismuth and yttrium.

4. A device as claimed in claim 1, characterized in that at the dodecahedral lattice sites the iron garnet consists essentially of bismuth, yttrium and a rare-earth metal.

5. A device as claimed in claim 1, characterized in that the iron garnet can be represented by the formula $$(Bi,Y,RE)_3(Fe,Mn,Q)_5O_{12}$$

where RE is at least one rare-earth metal, and Q is at least one element from the group consisting of germanium, silicon, aluminum, and gallium.

6. A device as claimed in claim 1, 2, 3, 4 or 5, characterized in that the device further comprises:
magnetic bias means for stablizing magnetic domains in the iron garnet layer;
means for generating magnetic domains in the iron garnet layer;
detector means for detecting the presence of magnetic domains in the iron garnet layer; and
propagation means for moving magnetic domains around the iron garnet layer.

7. A device as claimed in claim 6, characterized in that
the substrate has a lattice parameter $a_0$;
the iron garnet has a lattice parameter $a_1$ which is greater than $a_0$; and $$-1\times10^{-2}<(a_0-a_1)/a_0<-1\times10^{-3}.$$

* * * * *